US012774188B2

(12) United States Patent
Witczak et al.

(10) Patent No.: US 12,774,188 B2
(45) Date of Patent: Oct. 27, 2026

(54) ELEVATOR INSPECTION SYSTEM WITH ROBOTIC PLATFORM CONFIGURED TO DEVELOP HOISTWAY MODEL DATA FROM ELEVATOR SYSTEMS CONNECTED OVER A NETWORK

(71) Applicant: Otis Elevator Company, Farmington, CT (US)

(72) Inventors: Tadeusz Pawel Witczak, Farmington, CT (US); Joseph Crute, Cromwell, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 1756 days.

(21) Appl. No.: 16/819,598

(22) Filed: Mar. 16, 2020

(65) Prior Publication Data

US 2021/0284497 A1 Sep. 16, 2021

(51) Int. Cl.

| | |
|---|---|
| ***B66B 5/00*** | (2006.01) |
| ***B66B 3/00*** | (2006.01) |
| ***B66B 19/00*** | (2006.01) |
| ***G06F 30/13*** | (2020.01) |

(52) U.S. Cl.

CPC ............ *B66B 5/0025* (2013.01); *B66B 3/002* (2013.01); *B66B 19/00* (2013.01); *G06F 30/13* (2020.01)

(58) Field of Classification Search

CPC .... B66B 5/0025; B66B 5/0087; B66B 5/0018

USPC .......................................................... 187/391

See application file for complete search history.

(56) References Cited

U.S. PATENT DOCUMENTS

| | | | | |
|---|---|---|---|---|
| 4,649,515 | A * | 3/1987 | Thompson | G01R 31/318371 706/903 |
| 5,931,264 | A | 8/1999 | Gillingham et al. | |
| 7,823,706 | B2 * | 11/2010 | Tyni | B66B 5/0031 187/391 |
| 9,417,325 | B1 | 8/2016 | Bry et al. | |
| 10,836,610 | B2 | 11/2020 | Cambruzzi et al. | |
| 11,560,289 | B2 * | 1/2023 | Shah | B66B 5/0025 |
| 2004/0206583 | A1 * | 10/2004 | Mearns | B66B 5/0006 187/391 |
| 2016/0084628 | A1 | 3/2016 | Bjorni et al. | |

(Continued)

FOREIGN PATENT DOCUMENTS

| | | | | |
|---|---|---|---|---|
| CN | 107055230 | A | 8/2017 | |
| CN | 107416627 | A * | 12/2017 | B66B 5/0025 |

(Continued)

OTHER PUBLICATIONS

English Translation of CN 107416627 (Year: 2017).*

(Continued)

*Primary Examiner* — Jason L Vaughan

(74) *Attorney, Agent, or Firm* — CANTOR COLBURN LLP

(57) ABSTRACT

Disclosed is an elevator inspection system, having: a sensor implement; a robotic platform supporting the sensor implement, the robotic platform configured to inspect a hoistway; and a controller operationally connected to the robotic platform and the sensor implement, wherein the controller is configured to define hoistway model data, for the hoistway, from maintenance and performance data collected from disparately located elevator systems connected to communicate over a network.

18 Claims, 11 Drawing Sheets

(56) References Cited

U.S. PATENT DOCUMENTS

| | | | |
|---|---|---|---|
| 2016/0311657 | A1 | 10/2016 | Kilpeläinen |
| 2017/0355554 | A1 | 12/2017 | Eleid et al. |
| 2017/0355558 | A1 | 12/2017 | Khalil et al. |
| 2018/0044134 | A1 | 2/2018 | Copeland et al. |
| 2019/0177120 | A1 | 6/2019 | Studer et al. |
| 2019/0177123 | A1 | 6/2019 | Shah |
| 2019/0248013 | A1 | 8/2019 | Deyle et al. |
| 2019/0300336 | A1 | 10/2019 | Witczak et al. |
| 2019/0352125 | A1 | 11/2019 | Wooten et al. |
| 2020/0356102 | A1 | 11/2020 | Morse et al. |
| 2020/0363491 | A1 | 11/2020 | Studer et al. |
| 2021/0284495 | A1 | 9/2021 | Witczak et al. |
| 2021/0284496 | A1 | 9/2021 | Witczak et al. |
| 2021/0284498 | A1 | 9/2021 | Witczak et al. |
| 2021/0284503 | A1 | 9/2021 | Witczak et al. |

FOREIGN PATENT DOCUMENTS

| | | | |
|---|---|---|---|
| CN | 109665393 | A | 4/2019 |
| DE | 102020203254 | A1 | 9/2020 |
| EP | 3153452 | A1 | 4/2017 |
| EP | 3156359 | A1 | 4/2017 |
| EP | 3489184 | A1 | 5/2019 |
| EP | 3498649 | A1 | 6/2019 |
| EP | 3604193 | A1 | 2/2020 |
| JP | 4411371 | B1 | 2/2010 |
| JP | 2010189162 | A | 9/2010 |
| JP | 2017190251 | A | 10/2017 |
| JP | 2019001573 | A | 1/2019 |
| JP | 6542416 | B1 | 6/2019 |
| WO | 2017207597 | A1 | 12/2017 |
| WO | 2019063356 | A1 | 4/2019 |
| WO | 2020016925 | A1 | 1/2020 |
| WO | 2020039596 | A1 | 2/2020 |

OTHER PUBLICATIONS

Robotic Installation System for Elevators, Schindler Group, Accessed Online at https://www.schindler.com/com/internet/en/media/behind-the-scenes/stories/robotic-installation-system-for-elevators.html#button on Feb. 21, 2020 (2 pp.).

Chinese Office Action issued in CN202011393515.4; dated Aug. 16, 2023 without a translation.

European Search Report Issued in European Application No. 20216393.7-1017 dated Jun. 9, 2021; 8 Pages.

Diaz-Vilarino, L., et al., "3D Modeling of Building Indoor Spaces and Closed Doors from Imagery and Point Clouds" (2015) Sensors , 15(2), 3491-3512.

Ong Eng Huii, "Design and developmnet of 3D visual mapping system for elevator shaft inspection" Nanyang Technological University, 2019, 160 pages.

Schindler, "Schindler's Robotic System for Elevators" (Year: 2020), 2 pages.

T. K. Hui, and H. Chen, "Autonomous Elevator Inspection with Unmanned Aerial Vehicle", 2016 3rd Asia-Pacific World Congress on Computer Science and Engineering (APWC on CSE), Nadi, Fiji, 2016, pp. 26-33, doi: 10.1109/APWC-on-CSE.2016.016, 2016.

* cited by examiner

ELEVATOR INSPECTION SYSTEM WITH ROBOTIC PLATFORM CONFIGURED TO DEVELOP HOISTWAY MODEL DATA FROM ELEVATOR SYSTEMS CONNECTED OVER A NETWORK

BACKGROUND

Disclosed is an elevator inspection system and more specifically to an elevator inspection system with sensor implement supported by a robot or robotic platform.

Manually mapping an elevator shaft for installation of an elevator system can take an extensive amount of time and may be inexact. Similarly, manually inspecting an elevator shaft with an installed elevator system can also take an extensive amount of time and may be inexact. A solution is desired for reducing manual power required for these activities.

BRIEF SUMMARY

Disclosed is an elevator inspection system, having: a sensor implement; a robotic platform supporting the sensor, the robotic platform configured to inspect a hoistway: a controller operationally connected to the robotic platform and the sensor, wherein the controller is configured to define hoistway model data for the hoistway, from sensor data, corresponding to locations and shape boundaries of the hoistway and doorway openings formed in the hoistway.

In addition, or as an alternate, to one or more of the above disclosed aspects of the system, the controller is configured to define a three-dimensional hoistway model from the hoistway model data.

In addition, or as an alternate, to one or more of the above disclosed aspects of the system, the controller is configured to utilize the hoistway model data as a reference point for installing and/or maintaining one or more components in the hoistway.

In addition, or as an alternate, to one or more of the above disclosed aspects of the system, the controller is configured to define elevator car guide rail data, corresponding to a virtual elevator guide rail, in the hoistway model data.

In addition, or as an alternate, to one or more of the above disclosed aspects of the system, the controller is configured to determine, from the hoistway model data, sill to sill distances, guide rail to guide rail distances, and sill to guide rail distances for each of the doorway openings.

In addition, or as an alternate, to one or more of the above disclosed aspects of the system, the controller is configured to determine, from the hoistway model data, tilt and twist of the hoistway, locations and sizes of doorway openings.

In addition, or as an alternate, to one or more of the above disclosed aspects of the system, the controller is configured to define installation locations within the hoistway model data for elevator components.

In addition, or as an alternate, to one or more of the above disclosed aspects of the system, the controller is configured to control movement of the robotic platform in an hoistway, wherein the controller is operated manually, on SLAM (simultaneous localization and mapping), and/or on CAD (computer aided design) models.

In addition, or as an alternate, to one or more of the above disclosed aspects of the system, the sensor implement is one or more of a video sensor: an acoustic sensor; a LIDAR sensor; a camera; a laser sensor, a photogrammetry sensor, and a time of flight sensor.

In addition, or as an alternate, to one or more of the above disclosed aspects of the system, the robotic platform is a drone.

Further disclosed is a method of developing hoistway model data for a hoistway, including defining, by a controller, the hoistway model data for the hoistway, from sensor data, corresponding to locations and shape boundaries of the elevator hoistway shaft and doorway openings formed in the elevator hoistway shaft, wherein the sensor data is captured from a sensor implement that is supported by a robotic platform, wherein the robotic platform is configured to inspect the hoistway, and wherein the controller controls the robotic platform and the sensor implement.

In addition, or as an alternate, to one or more of the above disclosed aspects of the method, the method includes defining, by the controller, a three-dimensional hoistway model from the hoistway model data.

In addition, or as an alternate, to one or more of the above disclosed aspects of the method, the method includes utilizing, by the controller, the hoistway model data as a reference point for installing and/or maintaining one or more components in the hoistway.

In addition, or as an alternate, to one or more of the above disclosed aspects of the method, the method includes defining, by the controller, elevator car guide rail data, corresponding to a virtual elevator guide rail, in the hoistway model data.

In addition, or as an alternate, to one or more of the above disclosed aspects of the method, the method includes determining, by the controller from the hoistway model data, sill to sill distances, guide rail to guide rail distances, and sill to guide rail distances for each of the doorway openings.

In addition, or as an alternate, to one or more of the above disclosed aspects of the method, the method includes determining, by the controller from the hoistway model data, tilt and twist of the hoistway, locations and sizes of doorway openings.

In addition, or as an alternate, to one or more of the above disclosed aspects of the method, the method includes defining, by the controller, installation locations within the hoistway model data for elevator components, including the virtual guide rail.

In addition, or as an alternate, to one or more of the above disclosed aspects of the method, the method includes controlling, by the controller, movement of the robotic platform in the hoistway, where the controller is operated manually, on SLAM (simultaneous localization and mapping), and/or on CAD (computer aided design) models In addition, or as an alternate, to one or more of the above disclosed aspects of the method, the sensor implement is one or more of a video sensor: an acoustic sensor: a LIDAR sensor; a camera; a laser sensor, a photogrammetry sensor, and a time of flight sensor.

In addition, or as an alternate, to one or more of the above disclosed aspects of the method, the robotic platform is a drone.

Further disclosed is an elevator inspection system, having: a sensor implement: a robotic platform supporting the sensor implement, the robotic platform configured to inspect a hoistway; and a controller operationally connected to the robotic platform and the sensor implement, wherein the controller is configured to define hoistway model data, for the hoistway, from maintenance and performance data collected from disparately located elevator systems connected to communicate over a network.

In addition, or as an alternate, to one or more of the above disclosed aspects of the system, the controller is configured to define the hoistway model data from maintenance and performance data collected over the Internet and utilize cloud computing for analytics.

In addition, or as an alternate, to one or more of the above disclosed aspects of the system, the controller is configured to identify maintenance and performance trends from the collected maintenance and performance data.

In addition, or as an alternate, to one or more of the above disclosed aspects of the system, the controller is configured to define the hoistway model data to include, for an elevator car in the hoistway, one or more of: maintenance needs; ride quality: a motion profile; and door performance.

In addition, or as an alternate, to one or more of the above disclosed aspects of the system, the controller is configured to determining a frequency of monitoring the hoistway from the hoistway model data.

In addition, or as an alternate, to one or more of the above disclosed aspects of the system, the controller is configured to determine to substantially continuously monitor the hoistway from the hoistway model data.

In addition, or as an alternate, to one or more of the above disclosed aspects of the system, the controller is configured to further define the hoistway model data from sensed locations and shape boundaries of the hoistway and doorway openings formed in the hoistway.

In addition, or as an alternate, to one or more of the above disclosed aspects of the system, the controller is configured to define the hoistway model data to include sill to sill distances, guide rail to guide rail distances, sill to guide rail distances, and tilt and twist of the hoistway.

In addition, or as an alternate, to one or more of the above disclosed aspects of the system, the controller is configured to utilize the hoistway model data as a reference point for installing and/or maintaining one or more components in the hoistway.

In addition, or as an alternate, to one or more of the above disclosed aspects of the system, the controller is configured to transmit an alert upon identifying, from sensor data compared with hoistway model data, when a component of an elevator system installed in the hoistway is positioned or operating outside of predetermined positioning and operating tolerances.

Further disclosed is a method of determining whether components of an elevator system are positioned and operating within predetermined positioning and operating tolerances, including: defining, by a controller, hoistway model data, for a hoistway, from maintenance and performance data collected from disparately located elevator systems connected to communicate over a network, wherein the controller is operationally connected to a robotic platform supporting a sensor implement, and wherein the robotic platform configured to inspect the hoistway.

In addition, or as an alternate, to one or more of the above disclosed aspects of the method, the method includes defining, by the controller, the hoistway model data from maintenance and performance data collected over the Internet and utilizing cloud computing for analytics.

In addition, or as an alternate, to one or more of the above disclosed aspects of the method, the method includes identifying, by the controller, maintenance and performance trends from the collected maintenance and performance data.

In addition, or as an alternate, to one or more of the above disclosed aspects of the method, the method includes defining, by the controller, the hoistway model data to include, for an elevator car in the hoistway, one or more of: maintenance needs: ride quality; a motion profile; and door performance.

In addition, or as an alternate, to one or more of the above disclosed aspects of the method, the method includes determining, by the controller, a frequency of monitoring the hoistway from the hoistway model data.

In addition, or as an alternate, to one or more of the above disclosed aspects of the method, the method includes determining, by the controller, to substantially continuously monitor the hoistway from the hoistway model data.

In addition, or as an alternate, to one or more of the above disclosed aspects of the method, the method includes further defining, by the controller, the hoistway model data from sensed locations and shape boundaries of the hoistway and doorway openings formed in the hoistway.

In addition, or as an alternate, to one or more of the above disclosed aspects of the method, the method includes defining, by the controller, the hoistway model data to include sill to sill distances, guide rail to guide rail distances, sill to guide rail distances, and tilt and twist of the hoistway.

In addition, or as an alternate, to one or more of the above disclosed aspects of the method, the method includes utilizing, by the controller, the hoistway model data as a reference point for installing and/or maintaining one or more components in the hoistway.

In addition, or as an alternate, to one or more of the above disclosed aspects of the method, the method includes transmitting, by the controller, an alert upon identifying, from sensor data compared with hoistway model data, when a component of an elevator system installed in the hoistway is positioned or operating outside of predetermined positioning and operating tolerances.

Further disclosed is an elevator inspection system, having: a sensor implement: a robotic platform, which is portable, supporting the sensor implement, the robotic platform configured for inspecting and performing maintenance in a hoistway; a controller operationally connected to the robotic platform and the sensor implement, wherein the controller is configured to: control movement of the robotic platform within a hoistway; and inspect one or more components in the hoistway to determine, from sensor data compared with hoistway model data, that an operational parameter or an alignment of the one or more components is outside predetermined positioning and operating tolerances.

In addition, or as an alternate, to one or more of the above disclosed aspects of the system, the controller is configured to utilize the hoistway model data as a reference point for installing and/or maintaining one or more components in the hoistway.

In addition, or as an alternate, to one or more of the above disclosed aspects of the system, the controller is configured to control the robotic platform to execute one or more of: guide rail realignment: rope/belt inspection: ride quality tests; door couple alignment inspection: door switch test; and sill cleaning, to thereby determine that the operational parameter or the alignment of the component is outside predetermined positioning and operating tolerances.

In addition, or as an alternate, to one or more of the above disclosed aspects of the system, the controller is configured to determine a current position of the component relative to global positioning system (GPS) data.

In addition, or as an alternate, to one or more of the above disclosed aspects of the system, the controller is configured to engage a segment of an elevator guide rail of the hoistway shaft, to position the segment within predetermined positioning and operating tolerances, upon determining, from sensor data compared with hoistway model data, that the segment is positioned outside the predetermined positioning and operating tolerances In addition, or as an alternate, to one or more of the above disclosed aspects of the system, the controller is configured to engage the guide rail by loosening rail securing bolts, aligning the guide rail, and tightening rail securing bolts.

In addition, or as an alternate, to one or more of the above disclosed aspects of the system, the controller is configured to, periodically or within scheduled timeframes, engage the one or more components to determine that the operational parameter or the alignment of the component is outside predetermined positioning and operating tolerances.

In addition, or as an alternate, to one or more of the above disclosed aspects of the system, the controller is configured to define the hoistway model data from sensed locations and shape boundaries of the hoistway shaft and doorway openings formed in the hoistway shaft.

In addition, or as an alternate, to one or more of the above disclosed aspects of the system, the controller is configured to define the hoistway model data to include sill to sill distances, guide rail to guide rail distances, sill to guide rail distances, and tilt and twist of the hoistway.

In addition, or as an alternate, to one or more of the above disclosed aspects of the system, the controller is configured to define the hoistway model data as a three-dimensional model of the hoistway.

Further disclosed is a method of performing maintenance within a hoistway, including: controlling, by a controller, movement of a robotic platform within the hoistway; and inspecting, by the controller, one or more components in the hoistway to determine, from sensor data compared with hoistway model data, that an operational parameter or an alignment of the one or more components is outside predetermined positioning and operating tolerances, wherein the robotic platform is configured to inspect and perform maintenance in the hoistway, and wherein the controller is operationally connected to the robotic platform and a sensor implement supported by the robotic platform, and wherein the sensor implement is configured to capture the sensor data.

In addition, or as an alternate, to one or more of the above disclosed aspects of the method, the method includes utilizing, by the controller, the hoistway model data as a reference point for installing and/or maintaining one or more components in the hoistway.

In addition, or as an alternate, to one or more of the above disclosed aspects of the method, the method includes controlling, by the controller, the robotic platform to execute one or more of: guide rail realignment: rope/belt inspection: ride quality tests: door couple alignment inspection: door switch test; and sill cleaning, to thereby determine that the operational parameter or the alignment of the component is outside predetermined positioning and operating tolerances.

In addition, or as an alternate, to one or more of the above disclosed aspects of the method, the method includes determining, by the controller, a current position of the component relative to global positioning system (GPS) data.

In addition, or as an alternate, to one or more of the above disclosed aspects of the method, the method includes engaging, by the controller, a segment of an elevator guide rail of the hoistway shaft, to position the segment within predetermined positioning and operating tolerances, upon determining, from sensor data compared with hoistway model data, that the segment is positioned outside the predetermined positioning and operating tolerances In addition, or as an alternate, to one or more of the above disclosed aspects of the method, the method includes engaging, by the controller, the guide rail by loosening rail securing bolts, aligning the guide rail, and tightening rail securing bolts.

In addition, or as an alternate, to one or more of the above disclosed aspects of the method, the method includes engaging, by the controller periodically or within scheduled timeframes, the one or more components to determine that the operational parameter or the alignment of the component is outside predetermined positioning and operating tolerances.

In addition, or as an alternate, to one or more of the above disclosed aspects of the method, the method includes defining, by the controller, the hoistway model data from sensed locations and shape boundaries of the hoistway shaft and doorway openings formed in the hoistway shaft.

In addition, or as an alternate, to one or more of the above disclosed aspects of the method, the method includes defining, by the controller, the hoistway model data to include sill to sill distances, guide rail to guide rail distances, sill to guide rail distances, and tilt and twist of the hoistway.

In addition, or as an alternate, to one or more of the above disclosed aspects of the method, the method includes defining, by the controller, the hoistway model data as a three-dimensional model of the hoistway.

Further disclosed is an elevator inspection system, the system having: a robotic platform configured to inspect a hoistway: a platform propulsor operationally connected to the robotic platform; and a controller operationally connected to the platform propulsor, wherein the controller is configured to control the platform propulsor to propel the robotic platform vertically within the hoistway.

In addition, or as an alternate, to one or more of the above disclosed aspects of the system, the controller is configured to control friction pullies operationally connected between the robotic platform and a rope extending to a mechanical room atop the hoistway, to thereby propel the robotic platform.

In addition, or as an alternate, to one or more of the above disclosed aspects of the system, the controller is configured to control vacuum suction cups operationally connected between the robotic platform and hoistway side walls, to thereby propel the robotic platform.

In addition, or as an alternate, to one or more of the above disclosed aspects of the system, the controller is configured control rubber wheels operationally connected between the robotic platform and hoistway side walls, to thereby propel the robotic platform.

In addition, or as an alternate, to one or more of the above disclosed aspects of the system, the controller is configured control mechanical legs operationally connected between the robotic platform and hoistway side walls, to thereby propel the robotic platform.

In addition, or as an alternate, to one or more of the above disclosed aspects of the system, the controller is configured to control propellers operationally connected to the robotic platform, wherein the robotic platform is supported by a balloon, to thereby propel the robotic platform.

In addition, or as an alternate, to one or more of the above disclosed aspects of the system, the controller is configured to control a rail climber operationally connected to the robotic platform, to thereby propel the robotic platform.

In addition, or as an alternate, to one or more of the above disclosed aspects of the system, the controller is configured to control a rail climber operationally connected to the robotic platform, where the rail climber operationally engages a first rail that is adjacent a first hoistway sidewall, and a balance wheel of the rail climber is operationally positioned against a second hoistway side wall, to thereby propel the robotic platform In addition, or as an alternate, to one or more of the above disclosed aspects of the system, the controller is configured to control a drone that is, or is operationally connected to, the robotic platform, to thereby propel the robotic platform.

In addition, or as an alternate, to one or more of the above disclosed aspects of the system, the controller is configured to control one or more controllable tools supported on the robotic platform, whereby the robotic platform is configured for scanning and inspecting the hoistway, taking measurements, grinding, marking drilling points and drilling.

Further disclosed is a method of propelling a robotic platform within a hoistway, including: controlling, by a controller, a platform propulsor to propel the robotic platform vertically within the hoistway, wherein the robotic platform configured to inspect the hoistway, the platform propulsor is operationally connected to the robotic platform, and the controller is operationally connected to the platform propulsor.

In addition, or as an alternate, to one or more of the above disclosed aspects of the method, the method includes controlling, by the controller, friction pullies operationally connected between the robotic platform and a rope extending to a mechanical room atop the hoistway, to thereby propel the robotic platform.

In addition, or as an alternate, to one or more of the above disclosed aspects of the method, the method includes controlling, by the controller, vacuum suction cups operationally connected between the robotic platform and hoistway side walls, to thereby propel the robotic platform.

In addition, or as an alternate, to one or more of the above disclosed aspects of the method, the method includes controlling, by the controller, rubber wheels operationally connected between the robotic platform and hoistway side walls, to thereby propel the robotic platform.

In addition, or as an alternate, to one or more of the above disclosed aspects of the method, the method includes controlling, by the controller, mechanical legs operationally connected between the robotic platform and hoistway side walls, to thereby propel the robotic platform.

In addition, or as an alternate, to one or more of the above disclosed aspects of the method, the method includes controlling, by the controller, propellers operationally connected to the robotic platform, wherein the robotic platform is supported by a balloon, to thereby propel the robotic platform.

In addition, or as an alternate, to one or more of the above disclosed aspects of the method, the method includes controlling, by the controller, a rail climber operationally connected to the robotic platform, to thereby propel the robotic platform.

In addition, or as an alternate, to one or more of the above disclosed aspects of the method, the method includes controlling, by the controller, a rail climber operationally connected to the robotic platform, where the rail climber operationally engages a first rail that is adjacent a first hoistway sidewall, and a balance wheel of the rail climber is operationally positioned against a second hoistway side wall, to thereby propel the robotic platform In addition, or as an alternate, to one or more of the above disclosed aspects of the method, the method includes controlling, by the controller, a drone that is, or is operationally connected to, the robotic platform, to thereby propel the robotic platform.

In addition, or as an alternate, to one or more of the above disclosed aspects of the method, the method includes controlling, by the controller, one or more controllable tools supported on the robotic platform, whereby the robotic platform is configured for scanning and inspecting the hoistway, taking measurements, grinding, marking drilling points and drilling.

Further disclosed is an elevator inspection system, configured to inspect multiple elevator cars in a group of elevator cars, the system having: a sensor implement: a robot supporting the sensor implement; and a controller operationally connected to the robot and the senor, wherein the controller is configured to transmit an alert responsive to determining, from sensor data compared with elevator operational data, that an operational parameter of an elevator car in which the robot is located is outside a predetermined threshold.

In addition, or as an alternate, to one or more of the above disclosed aspects of the system, the controller is configured to determine whether ride-quality is outside the predetermined threshold, to thereby determine that the operational parameter is outside the predetermined threshold.

In addition, or as an alternate, to one or more of the above disclosed aspects of the system, the controller is configured to determine whether acceleration is outside the predetermined threshold, to thereby determine that the ride-quality is outside the predetermined threshold.

In addition, or as an alternate, to one or more of the above disclosed aspects of the system, the controller is configured to determine whether operational acoustics are outside the predetermined threshold, to thereby determine that the ride-quality is outside the predetermined threshold.

In addition, or as an alternate, to one or more of the above disclosed aspects of the system, the controller is configured to communicate with an elevator car control panel, to thereby determine that the operational parameter is outside the predetermined threshold.

In addition, or as an alternate, to one or more of the above disclosed aspects of the system, the controller is configured to instruct the elevator car control panel to execute one or more of runs between levels, emergency stops, and open/close door cycles, to thereby determine that the operational parameter is outside the predetermined threshold.

In addition, or as an alternate, to one or more of the above disclosed aspects of the system, the controller is configured to: verify operation of COP lights; confirm elevator car leveling accuracy; clean the elevator car via the robot; and/or change elevator car controller settings to minimize effects of a bed quality of a ride.

In addition, or as an alternate, to one or more of the above disclosed aspects of the system, the controller is configured communicate with the elevator car control panel over a wireless network.

In addition, or as an alternate, to one or more of the above disclosed aspects of the system, the controller is configured to control the sensor implement to obtain the sensor data during predetermined periods of time and/or when the elevator car is without passengers.

In addition, or as an alternate, to one or more of the above disclosed aspects of the system, the controller, which is onboard the robot, is configured to transmit the alert to an elevator group controller over a cellular network.

Further disclosed is a method of performing an elevator operational inspection with a robot, including: transmitting, by a controller, an alert responsive to determining, from sensor data compared with elevator operational data, that an operational parameter of an elevator car in which the robot is located is outside a predetermined threshold, wherein the controller is operationally connected to the robot and a senor implement supported by the robot, and wherein the controller is configured to control the sensor implement to obtain the sensor data.

In addition, or as an alternate, to one or more of the above disclosed aspects of the method, the method includes determining, by the controller, whether ride-quality is outside the predetermined threshold, to thereby determine that the operational parameter is outside the predetermined threshold.

In addition, or as an alternate, to one or more of the above disclosed aspects of the method, the method includes determining, by the controller, whether acceleration is outside the predetermined threshold, to thereby determine that the ride-quality is outside the predetermined threshold.

In addition, or as an alternate, to one or more of the above disclosed aspects of the method, the method includes determining, by the controller, whether operational acoustics are outside the predetermined threshold, to thereby determine that the ride-quality is outside the predetermined threshold.

In addition, or as an alternate, to one or more of the above disclosed aspects of the method, the method includes communicating, by the controller, with an elevator car control panel, to thereby determine that the operational parameter is outside the predetermined threshold.

In addition, or as an alternate, to one or more of the above disclosed aspects of the method, the method includes instructing, by the controller, the elevator car control panel to execute one or more of runs between levels, emergency stops, and open/close door cycles, to thereby determine that the operational parameter is outside the predetermined threshold.

In addition, or as an alternate, to one or more of the above disclosed aspects of the method, the method includes verifying, by the controller, operation of COP lights; confirming, by the controller, elevator car leveling accuracy; clean, by the controller via the robot, the elevator car; and/or changing, by the controller, elevator car controller settings to minimize effects of a bed quality of a ride.

In addition, or as an alternate, to one or more of the above disclosed aspects of the method, the method includes communicating, by the controller, with the elevator car control panel over a wireless network.

In addition, or as an alternate, to one or more of the above disclosed aspects of the method, the method includes controlling, by the controller, the sensor implement to obtain the sensor data during predetermined periods of time and/or when the elevator car is without passengers.

In addition, or as an alternate, to one or more of the above disclosed aspects of the method, the method includes transmitting, by the controller, which is onboard the robot, the alert to an elevator group controller over a cellular network.

BRIEF DESCRIPTION OF THE DRAWINGS

The present disclosure is illustrated by way of example and not limited in the accompanying figures in which like reference numerals indicate similar elements.

DETAILED DESCRIPTION

Figure 1:
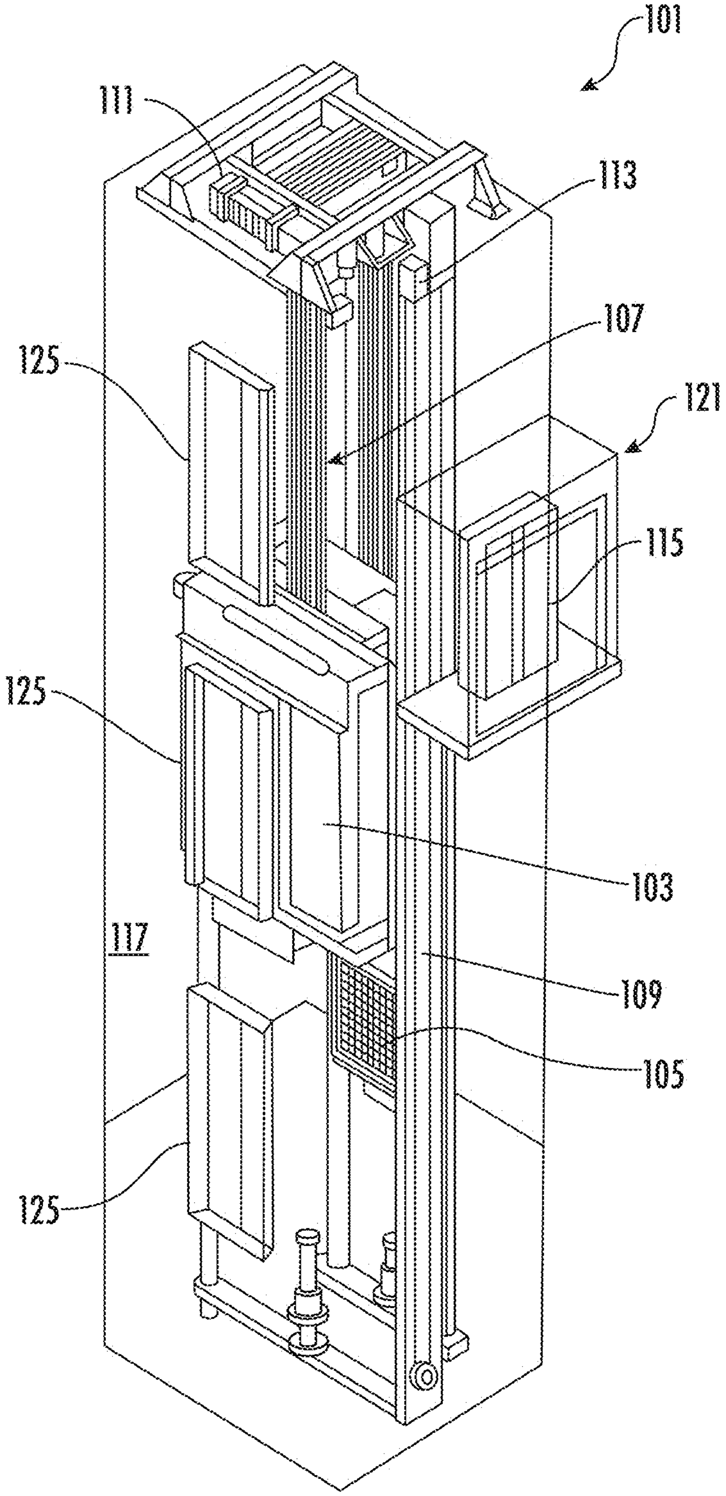
FIG. 1 is a schematic illustration of an elevator system that may employ various embodiments of the present disclosure.

FIG. 1 is a perspective view of an elevator system 101 including an elevator car 103, a counterweight 105, a tension member 107, a guide rail 109, a machine 111, a position reference system 113, and a controller 115. The elevator car 103 and counterweight 105 are connected to each other by the tension member 107. The tension member 107 may include or be configured as, for example, ropes, steel cables, and/or coated-steel belts. The counterweight 105 is configured to balance a load of the elevator car 103 and is configured to facilitate movement of the elevator car 103 concurrently and in an opposite direction with respect to the counterweight 105 within an (elevator shaft) hoistway 117 and along the guide rail 109.

The tension member 107 engages the machine 111, which is part of an overhead structure of the elevator system 101. The machine 111 is configured to control movement between the elevator car 103 and the counterweight 105. The position reference system 113 may be mounted on a fixed part at the top of the hoistway 117, such as on a support or guide rail, and may be configured to provide position signals related to a position of the elevator car 103 within the hoistway 117. In other embodiments, the position reference system 113 may be directly mounted to a moving component of the machine 111, or may be located in other positions and/or configurations as known in the art. The position reference system 113 can be any device or mechanism for monitoring a position of an elevator car and/or counter weight, as known in the art. For example, without limitation, the position reference system 113 can be an encoder, sensor implement, or other system and can include velocity sensing, absolute position sensing, etc., as will be appreciated by those of skill in the art.

The controller 115 is located, as shown, in a controller room 121 of the hoistway 117 and is configured to control the operation of the elevator system 101, and particularly the elevator car 103. For example, the controller 115 may provide drive signals to the machine 111 to control the acceleration, deceleration, leveling, stopping, etc. of the elevator car 103. The controller 115 may also be configured to receive position signals from the position reference system 113 or any other desired position reference device. When moving up or down within the hoistway 117 along guide rail 109, the elevator car 103 may stop at one or more landings 125 as controlled by the controller 115. Although shown in a controller room 121, those of skill in the art will appreciate that the controller 115 can be located and/or configured in other locations or positions within the elevator system 101. In one embodiment, the controller may be located remotely or in the cloud.

The machine 111 may include a motor or similar driving mechanism. In accordance with embodiments of the disclosure, the machine 111 is configured to include an electrically driven motor. The power supply for the motor may be any power source, including a power grid, which, in combination with other components, is supplied to the motor. The machine 111 may include a traction sheave that imparts force to tension member 107 to move the elevator car 103 within hoistway 117.

Although shown and described with a roping system including tension member 107, elevator systems that employ other methods and mechanisms of moving an elevator car within an elevator shaft may employ embodiments of the present disclosure. For example, embodiments may be employed in ropeless elevator systems using a linear motor to impart motion to an elevator car. Embodiments may also be employed in ropeless elevator systems using a hydraulic lift to impart motion to an elevator car. FIG. 1 is merely a non-limiting example presented for illustrative and explanatory purposes.

The following figures illustrate additional technical features associated with one or more disclosed embodiments. Features disclosed in the following figures having nomenclature similar to features disclosed in FIG. 1 may be similarly construed though being positively reintroduced with numerical identifiers that may differ from those in FIG. 1. Further, process steps disclosed hereinafter may be sequentially numbered to facilitate discussion of one or more disclosed embodiments. Such numbering is not intended to identify a specific sequence of performing such steps or a specific requirement to perform such steps unless expressly indicated.

Figure 2:
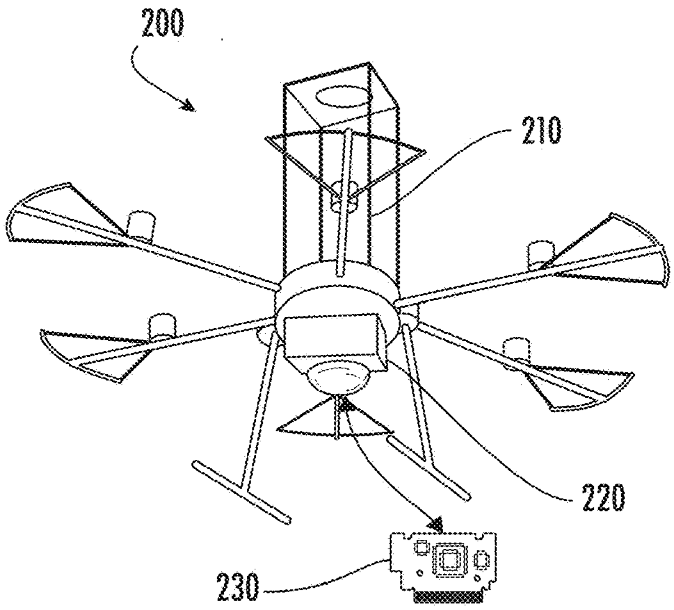
FIG. 2 shows a robotic platform in a hoistway to develop a model for an installation.
Figure 3:
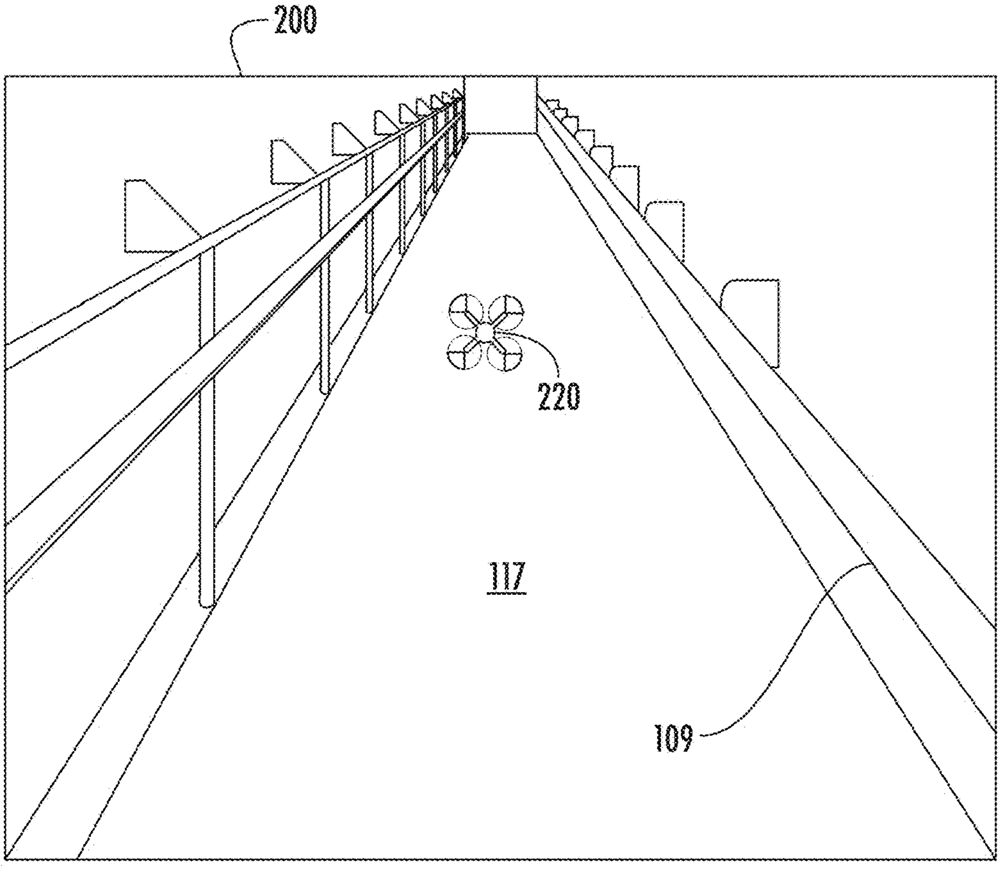
FIG. 3 is a closeup of the robotic platform in the hoistway.
Figure 4:
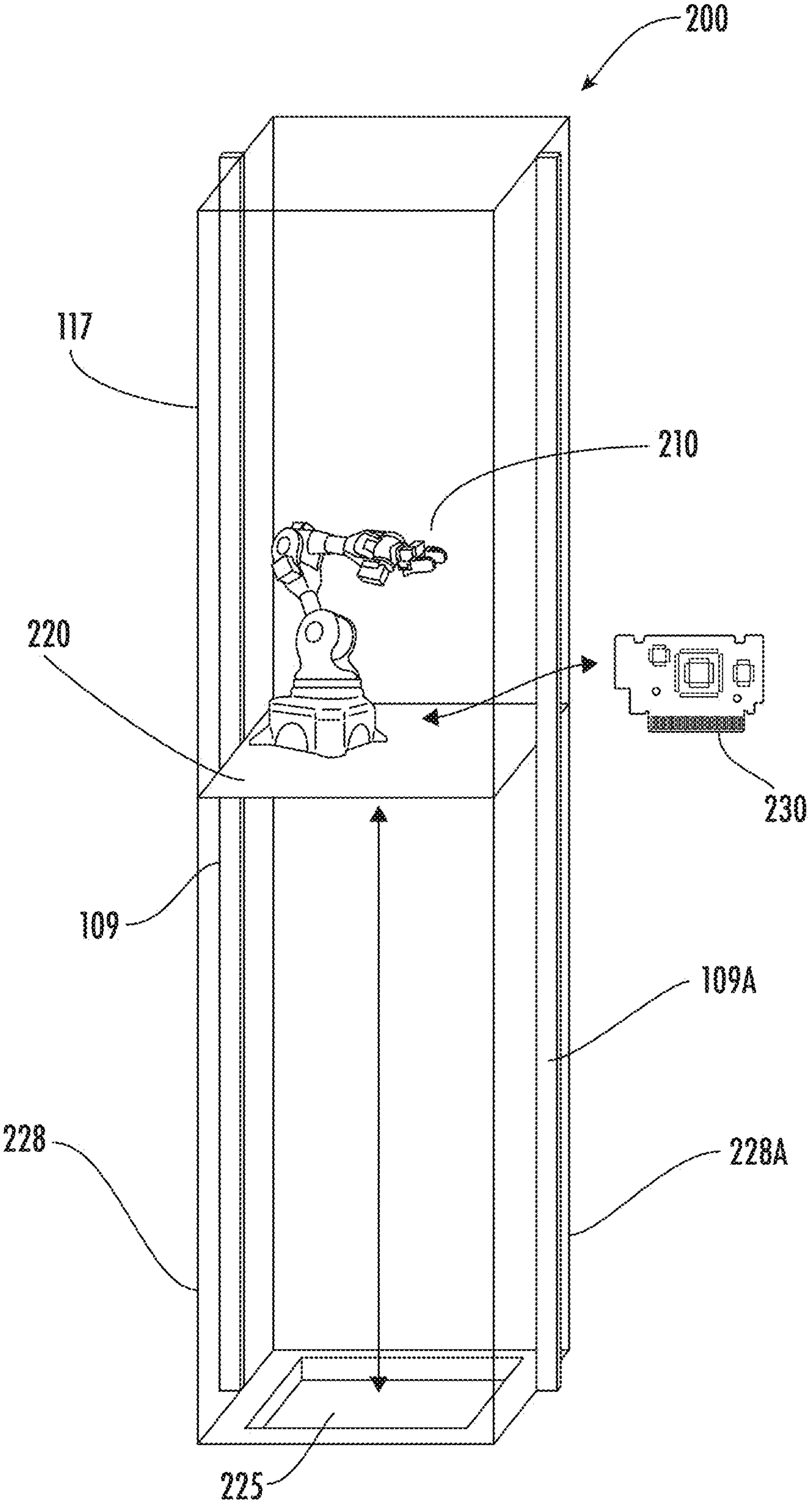
FIG. 4 shows additional aspects of a robotic platform in a hoistway to develop a model for an installation.

Turning to FIGS. 2-4, an elevator inspection system (inspection system) 200 is shown, which may be utilized to install an elevator system in a hoistway 117. The inspection system 200 provides high precision over an entire height (or length) of the hoistway 117. The inspection system 200 includes a position reference system that is able to precisely identify height and also twist (or rotation) and tilt (or bend) of the hoistway 117. The inspection system 200 includes a sensor implement 210 (or more than one sensor implement 210, including peripheral and onboard sensor implements, etc.) that enables a definition of a reliable reference point, which is beneficial for robotic systems, for defining hoistway data, which may represent a three-dimensional (3D) hoistway model (e.g., a virtual model). The hoistway data may function as reference data for installing, upgrading, maintaining, and/or inspecting an elevator system.

The inspection system 200 includes a robotic platform 220, which can move along the hoistway 117. The hoistway data may be embedded in electronics stored in a platform controller (controller) 230 that is onboard the robotic platform 220. The reference system may be an earlier defined map of the hoistway 117, serving as a reference point. Alternatively, the controller 230 may utilize software, such as a computer aided engineering or design (CAE or CAD) software to define a map as it travels, using laser (which may utilize one, two or three dimensional scanning), camera, or acoustic sensor. The inspection system 200 may allow for identifying height, sill to sill, rail to door, rail to rail, wall to wall measurements. Collected data may be used for installation, inspection or service. With the utilization of a high precision position robot, robotic platforms may be equipped with power tools and perform precision tasks.

Benefits of the disclosed embodiments includes a decreased time to market for an elevator system, freeing time for a mechanic, providing a competitive advantage based on a quickly and precisely installed elevator system, increased precision of an installation, an extended product life time, and an increased installation quality and an improved ride quality.

In FIGS. 2-3, the robotic platform 220 is a drone and in FIG. 4 the robotic platform 220 is shown as supporting a robotic arm 250. Herein, reference to one form of the robotic platform (or robotic arm) is not intended on limiting the type of robotic platform (or robotic arm) utilized for the inspection system 200. The robotic platform 220 may be equipped with the sensor implement 210, suitable for reference and scanning operations, including but not limited to a stereovision camera, an acoustic sensor, a LIDAR (light and radar detection) sensor, a photogrammetry sensor, a laser sensor, which allow for the build of a substantially complete three dimensional image of the hoistway 117. Hoistway measurements for the hoistway data are obtained from the inspection system 200 within the hoistway. The measurements include rail to rail, door width, hoistway depth and width, rail to rail, etc., which would otherwise be performed manually for each landing in the hoistway.

Further, an elevator mechanic may desire to receive hoistway measurements from a general contractor to check whether the installed elevator system 101 is built and maintained according to predetermined specifications. The hoistway model, which may have been developed before an initial install of the elevator system 101, may function as a reference system that virtually marks installation locations for substantially each component in the hoistway 117. The hoistway model may be utilized for identifying skew (twist/tilt) in the hoistway 117, and damage to the hoistway 117, which is not readily attainable from manual discrete landing measurements.

According to an embodiment, the inspection system 200 may be utilized in different applications for elevator installation and subsequent service. The disclosed application may be beneficial for time and cost saving which may lead to higher field efficiency. Measurements taken by the inspection system 200 include, as indicated, a three dimensional model showing tilt, twist, and/or deformation (e.g., defects in the structure) of the hoistway, guide rail to guide rail measurements, guide rail to sill measurements, sill to sill measurements, etc. The measurements provide a reference to specific landing and global reference points. The robotic platform 220 may be stationary (for example, located in a hoistway pit 225 or on a landing) or may move in the hoistway 117.

Benefits of the disclosed embodiments include a reduced field time for a mechanic to discover and address issues during and subsequent to installation, thereby providing a competitive advantage, along with an increased precision of an elevator car 103 and an extended product life time. System performance tracking is also enhanced. A global data base for condition based monitoring (CBM) and predictive maintenance may also be performed. The reference system defined by the hoistway model, and a global data base (discussed in greater detail below), may allow for precise installation of the equipment in the hoistway 117. The robotic platform 220 may be used to map the hoistway 117 with higher resolution than can be obtained by individual, discrete landing measurement. The disclosed system may allow for the use advance automation commercial off the shelf solutions such as robotic arms.

Thus, as indicated (FIGS. 2-4), the elevator inspection system includes the sensor implement 210 and the robotic platform 220 supporting the sensor implement 210, where the robotic platform 220 is configured to inspect the hoistway 117. The controller 230 is operationally connected to the robotic platform 220 and the sensor implement 210. In one embodiment the sensor implement 210 is a video sensor and/or acoustic sensor. In one embodiment the robotic platform 220 is a drone.

Figure 5:
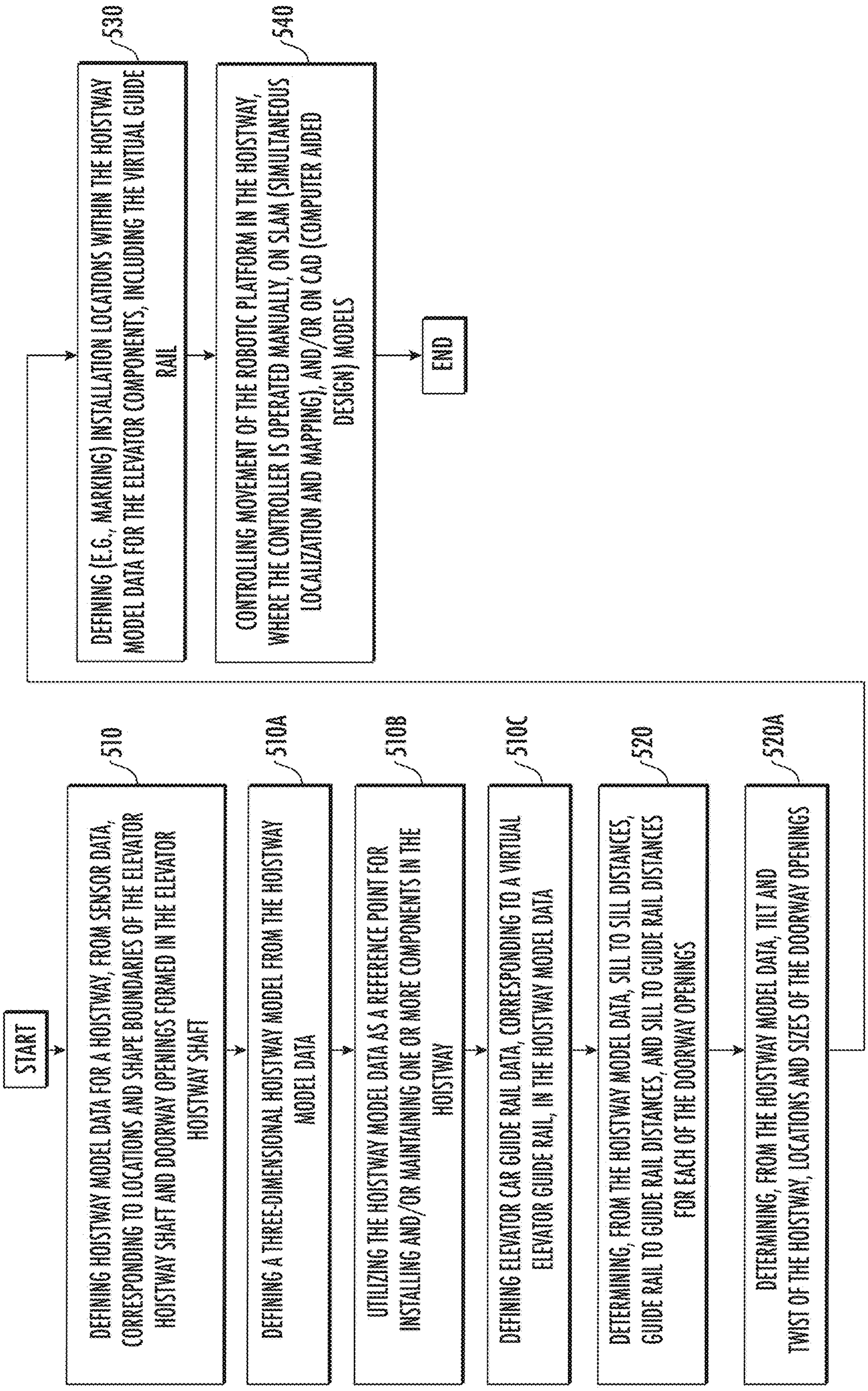
FIG. 5 is a flowchart showing a method of developing hoistway model data for the hoistway.

Turning to FIG. 5, a method is disclosed for developing hoistway model data for a hoistway 117. The hoistway 117 may not yet include an elevator system (elevator car 103, guide rail 109, etc.), and the hoistway model may be utilized for the installation process. Alternatively the hoistway 117 may include elevator system (elevator car 103, guide rail 109, etc.), and the hoistway model may be utilized for the inspection and maintenance.

As shown in block 510 the method includes the controller 230 defining hoistway model data for the hoistway 117, from sensor data, corresponding to locations and shape boundaries of the hoistway 117 and doorway openings (at various levels) formed in the hoistway 117.

As shown in block 510A the method includes the controller 230 defining a three-dimensional hoistway model from the hoistway model data.

As shown in block 510B, the method includes the controller 230 utilizing the hoistway model data as a reference point for installing and/or maintaining one or more components in the hoistway.

As shown in block 510C the method includes the controller 230 defining elevator car guide rail data, corresponding to a virtual elevator guide rail 109, in the hoistway model data. That is, in conditions where the elevator system is not yet installed, the model will include a virtual elevator guide rail at a location where the actual elevator guide rail 109 is to be installed.

As shown in block 520, the method includes controller 230 determining, from the hoistway model data, sill to sill distances, guide rail to guide rail distances, and sill to guide rail distances for each of the doorway openings.

As shown in block 520A, the method includes the controller 230 determining, from the hoistway model data, tilt and twist of the hoistway 117, locations and sizes of doorway openings.

As shown in block 530, the method includes the controller 230 defining (e.g., marking) installation locations within the hoistway model data for elevator components, including the virtual guide rail.

According to some embodiments the model comprises a 3 dimensional model representation of the hoistway. The model may also comprise a CAD model or a video rendering of the hoistway. In additional embodiments the model may comprise a rendering of the elevator components including a listing of components for the elevator installation.

As shown in block 540, the method includes the controller controlling movement of the robotic platform 220 in the hoistway 117, where the controller is operated manually, on SLAM (simultaneous localization and mapping), and/or on CAD models. As indicated above, in some embodiments the robotic platform 220 is stationary.

According to an additional aspect of the disclosed embodiments, in the growing market of internet of things (IoT), data is a valuable asset. Having easy-to-access information on system performance and operational parameters and a system that can self-diagnose adds value to the field. Additionally, historic performance data, trends and patterns from tests performed on elevator systems locally, regionally and globally may be utilized to monitor quality and service performance of an elevator system.

Thus, utilizing the inspection system 200, different types of measurements can be collected to capture a set of variables that defines system operational performance in different operational stages of the elevator system 101. Such measurements include, for example, straightness of the hoistway 117, landing to landing (sill to sill) measurements, a three dimensional model of hoistway 117, guide rail to guide rail 109, 109A (FIG. 4) measurements, and wall to wall 228, 228A, measurements. Collecting this data allows for significant time savings in the field. Maintenance, ride quality, motion profile, door performance, amount of light in the car, cabin operation panel (COP) buttons, may all be monitored and maintained based on recorded data. Constant or periodic monitoring of system performance without a need of an onsite mechanic may allow for cost savings and for marketing new products.

Benefits of the utilizing data as described herein is a decreased time to market, freeing mechanic time, providing a competitive advantage due to decreased costs on manpower, increased precision, increased mechanic safety. The embodiments enable building a digital data base of global measurements, will improve design approaches and enable new products and services.

Thus, as indicated (FIGS. 2-4), the inspection system 200 includes the sensor implement 210, the robotic platform 220 supporting the sensor implement 210, and a controller 230 operationally connected to the robotic platform 220 and the sensor implement 210. The sensor implement 210 may be one or more of a video sensor; an acoustic sensor: a LIDAR (light and radar) sensor; a camera; a laser sensor, a photogrammetry sensor, and a time of flight sensor. As indicated the robotic platform 220 is configured for inspecting the hoistway 117.

Figure 6:
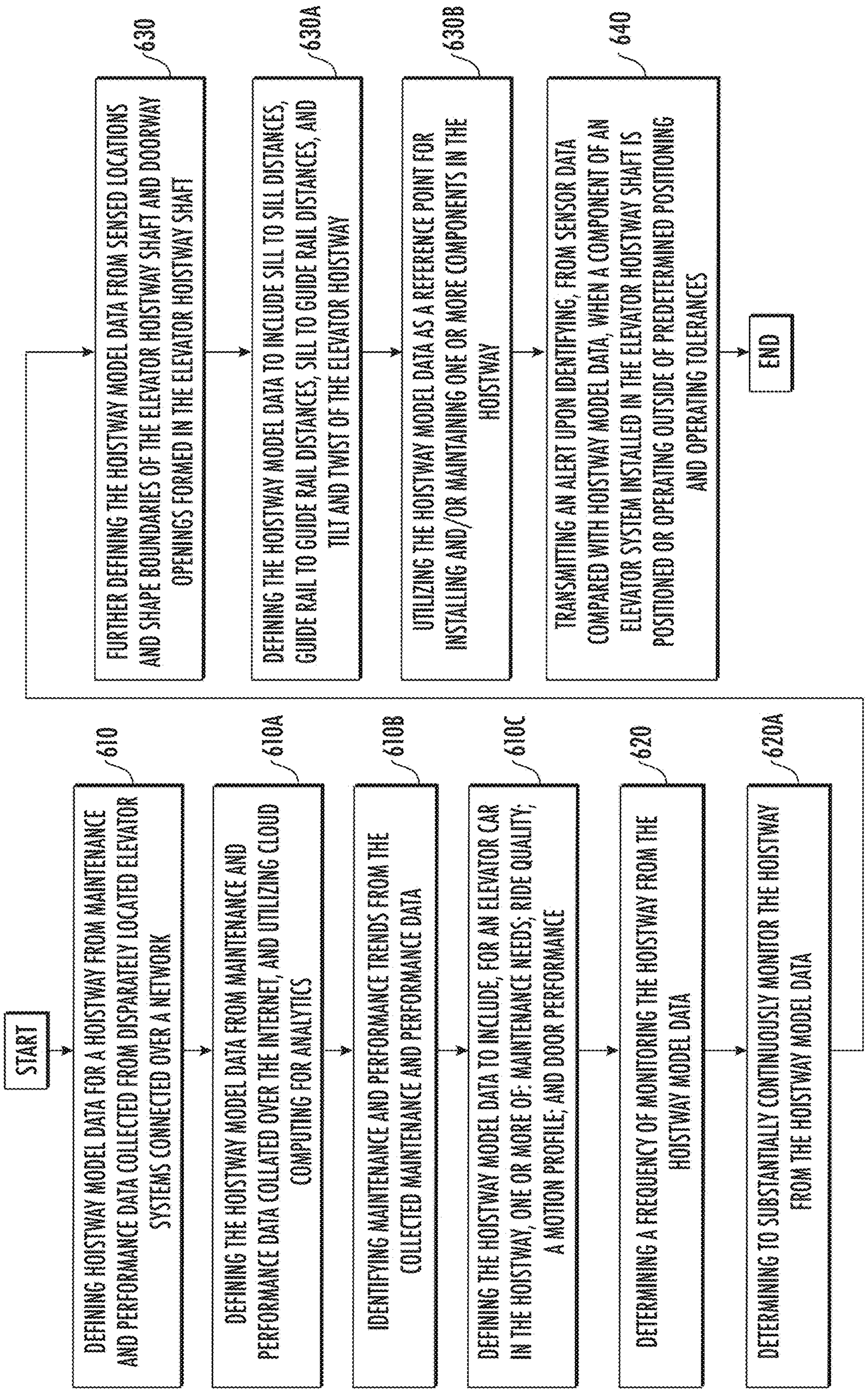
FIG. 6 is a flowchart shows a method of determining whether components of an installed elevator system are operating within predetermined positional tolerances based on the utilization of datasets, e.g., collected over the internet.

Turning to FIG. 6, a flowchart shows a method of determining whether components of an installed elevator system 101 are positioned and operating within predetermined positioning and operating tolerances based on the utilization of datasets, e.g., collected over the internet.

As shown in block 610, the method includes the controller 230 defining hoistway model data for the hoistway 117, from maintenance and performance data collected from disparately located elevator systems connected to communicate over a network. The hoistway model data may be utilized to build a virtual model for a new installation of an elevator system.

As shown in block 610A, the method includes the controller 230 defining the hoistway model data from maintenance and performance data collected over the Internet.

As shown in block 610B, the method includes the controller 230 identifying maintenance and performance trends from the collected maintenance and performance data.

As shown in block 610C the method includes the controller 230 defining the hoistway model data to identify, for an elevator car 103 in the hoistway 117, one or more of: maintenance needs; ride quality; a motion profile; and door performance requirements.

As shown in block 620, the method includes the controller 230 determining a frequency of monitoring the hoistway 117 from the hoistway model data.

As shown in block 620A, the method includes the controller determining to substantially continuously monitor the hoistway 117 from the hoistway model data.

As shown in block 630, the method includes the controller 230 further defining the hoistway model data from sensed locations and shape boundaries of the hoistway 117 and doorway openings formed in the hoistway 117.

As shown in block 630A, the method includes the controller 230 defining the hoistway model data to include sill to sill distances, guide rail to guide rail distances, sill to guide rail distances, and tilt and twist of the hoistway. In one embodiment the hoistway model data defines a three-dimensional model of the hoistway 117.

As shown in block 630B, the method includes the controller 230 utilizing the hoistway model data as a reference point for installing and/or maintaining one or more components in the hoistway.

As shown in block 640, the method includes the controller 230 transmitting an alert upon identifying, from sensor data compared with hoistway model data, when a component of an elevator system installed in the hoistway 117 is positioned or operating outside of predetermined positioning and operating tolerances. In one embodiment the component is the guide rail 109.

According to another aspect of the disclosed embodiments, precise hoistway measurements are important for maintenance purposes. Mechanics may receive a hoistway assignment from a general contractor and check if components in the hoistway 117 are installed and/or operating according to specifications. If the mechanic builds a reference system and marks installation locations for each component in the hoistway, the mechanic may not realize from this process whether there is hoistway skew.

The disclosed embodiments provide measurement applications of the robotic platform 220 with the utilization of a reference system for an elevator installation and subsequent service. Described utilizations are beneficial for time and cost saving which leads to higher field efficiency.

Figure 9:
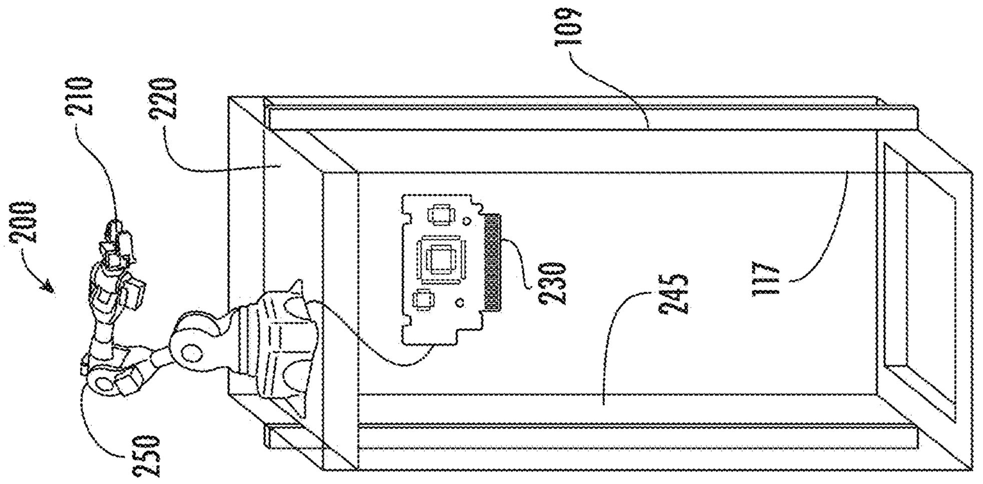
FIG. 9 shows a robotic platform for engaging an elevator guide rail that is positioned out of tolerances, wherein the robotic platform is located midway along a height of the hoistway.
Figure 8:
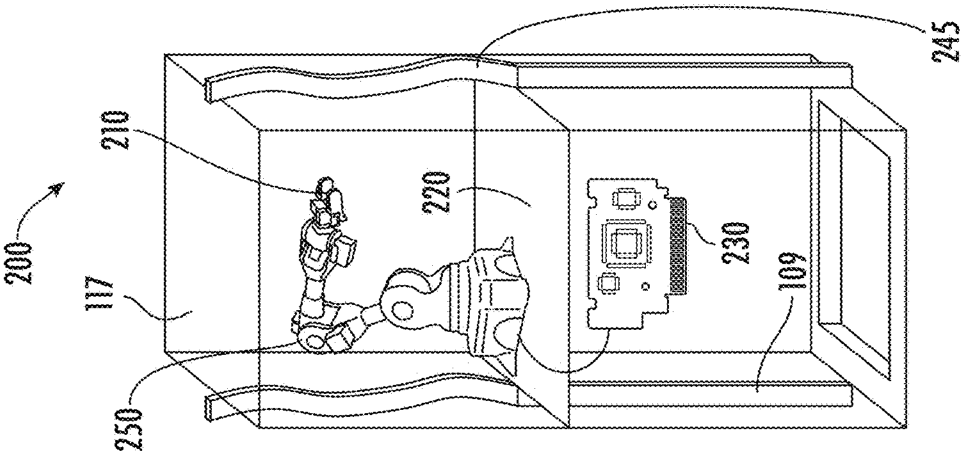
FIG. 8 shows a robotic platform for engaging an elevator guide rail that is positioned out of tolerances, wherein the robotic platform is located midway along a height of the hoistway.
Figure 7:
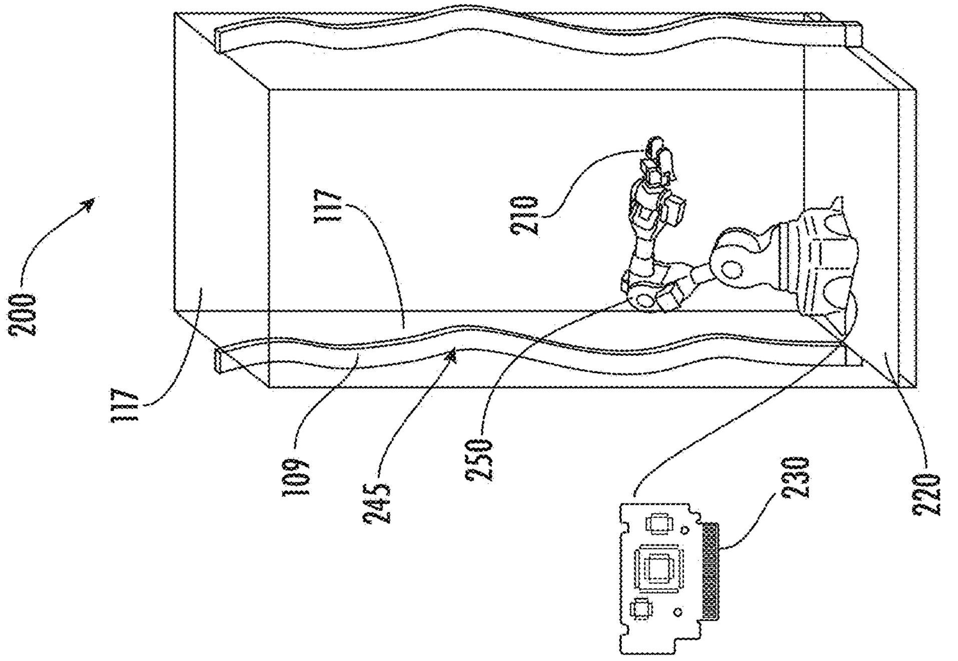
FIG. 7 shows a robotic platform for engaging an elevator guide rail that is positioned out of tolerances, wherein the robotic platform is located at a bottom of the hoistway.

Turning to FIGS. 7-9, as one example, maintenance of a guide rail requiring realignment is shown. Such maintenance may include loosening bolts, aligning the guide rail 109, and then tightening the bolts. Other examples may include rope/belt inspections and maintenance, periodic and scheduled ride quality tests, door coupler alignment, door switch tests and sill cleaning. The robotic platform 220 is assigned/mounted in the hoistway 117, or, e.g., a portable device is provided that may be installed in the hoistway 117, e.g., on the rail(s). In an alternate embodiment the robotic arm 250 may be mounted to the top of an elevator car.

Benefits of the disclosed embodiments is a field time reduction for mechanics, improved safety for the mechanics as robotic platforms may be utilized in relatively dangerous locations, a competitive advantage based on fewer mechanic hours needed for maintenance, an increased precision and an extended product life time for the elevator system. In addition, system performance tracking is available as well as a global data base for CBM and predictive maintenance.

For example in FIG. 7, the robotic platform 220 is controlled to loosen each the guide rail 109 and adjust and tighten each guide rail 109, as the robotic platform 220 moves heightwise along the hoistway 117. During this process, the robotic platform 220 may make test runs on each guide rail 109 to verify the adjustment using the sensor implement 210, which may be one or more onboard ride quality sensor implements. The maintenance process may be repeated if needed on a full length of each guide rail 109, or the maintenance process may be performed along a discrete section of each guide rail 109.

The robotic platform 220 may be fully autonomous or may be provided with mechanic support. Other applications of the maintenance process may include hoistway door service, rope inspection and door couplers alignment. A robotic arm 250 (FIGS. 7-9) is supported on the robotic platform 220 one non-limiting example. However the robotic platform 220 may be adjusted to the task and may have a set of tools that can be changed.

As indicated (FIGS. 2-5 and 7-9), the elevator inspection system includes a sensor implement 210, a robotic platform 220, which is portable, supporting the sensor implement 210, and a controller operationally connected to the robotic platform 220 and the sensor implement 210. As indicated the robotic platform 220 is configured for inspecting and performing maintenance in the hoistway 117.

Figure 10:
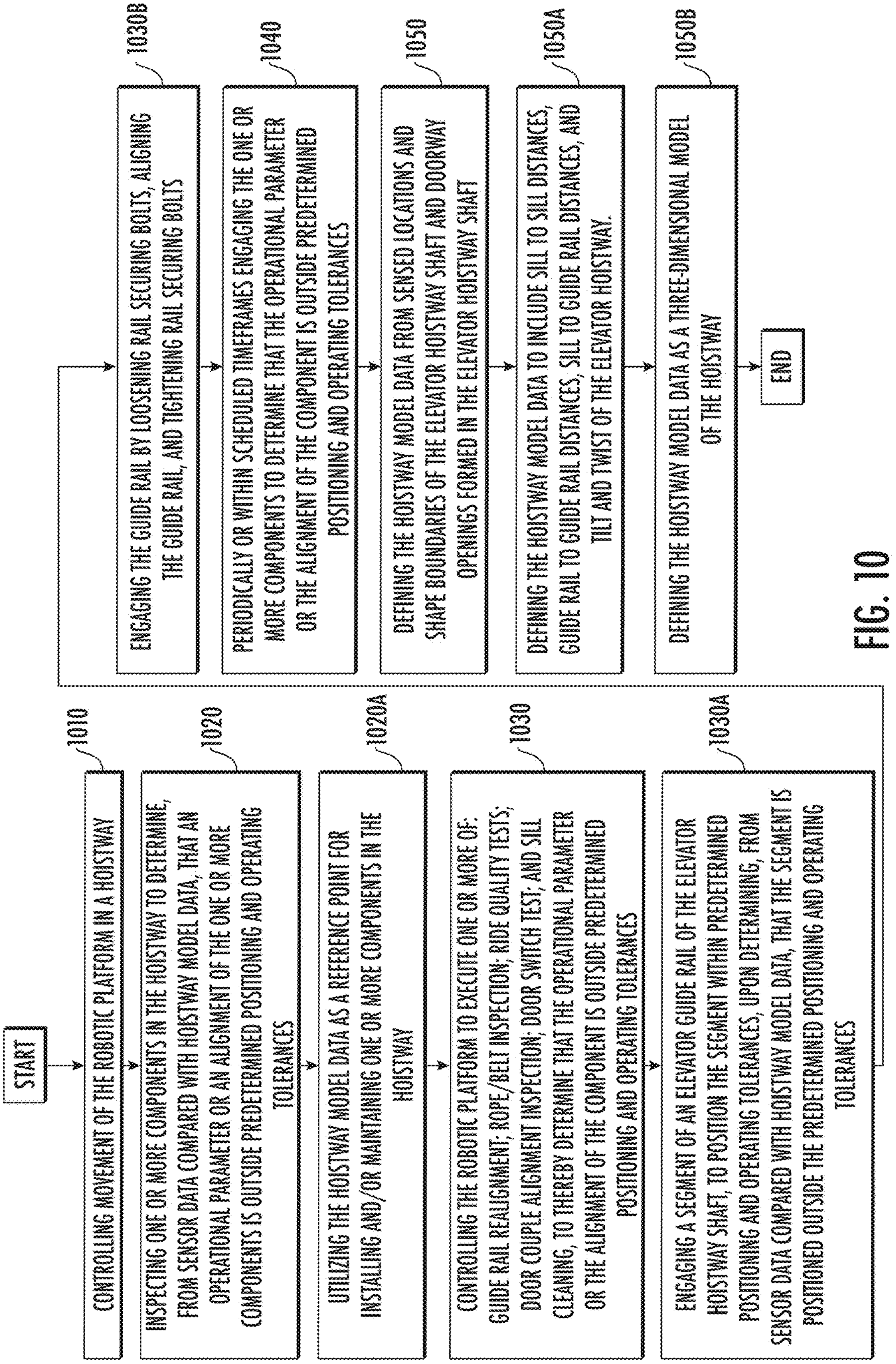
FIG. 10 is a flowchart showing a method of performing maintenance in a hoistway.
Figure 11:
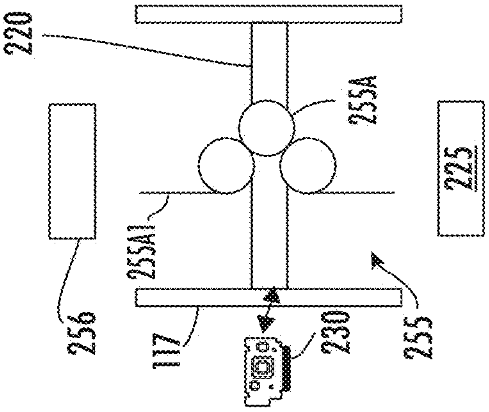
FIG. 11 shows a platform propulsor formed as controllable friction pullies.
Figure 12:
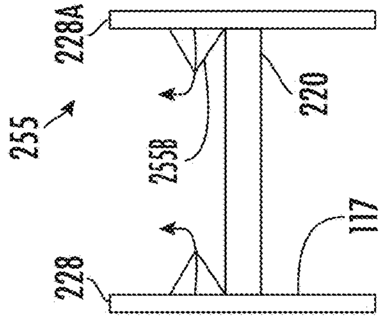
FIG. 12 shows a platform propulsor formed as controllable vacuum suction cups.
Figure 13:
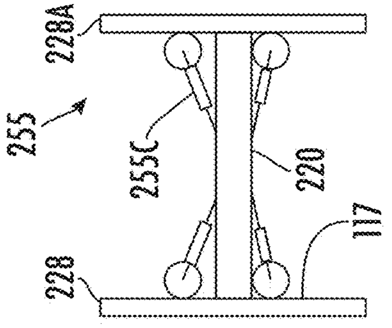
FIG. 13 shows a platform propulsor formed as controllable rubber wheels.
Figure 14:
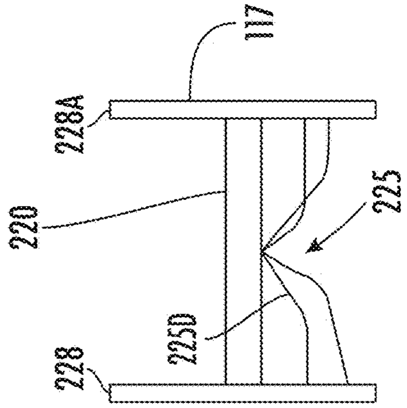
FIG. 14 shows a platform propulsor formed as controllable mechanical legs.
Figure 15:
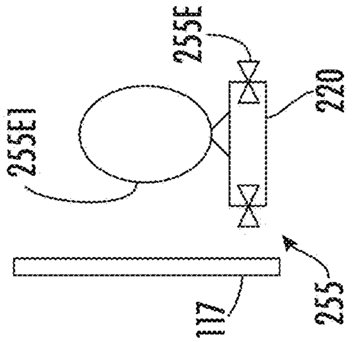
FIG. 15 shows a platform propulsor formed as controllable propellers, wherein the robotic platform is supported with a balloon.
Figure 16:
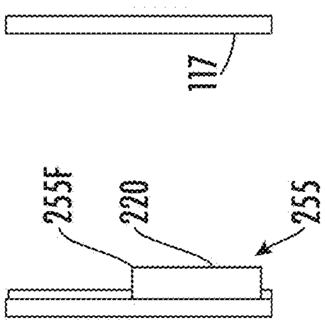
FIG. 16 shows a platform propulsor formed as a rail climber.
Figure 17:
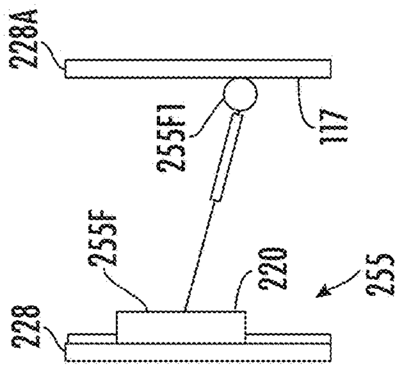
FIG. 17 shows a platform propulsor formed as a rail clamber configured with a balance wheel.
Figure 18:
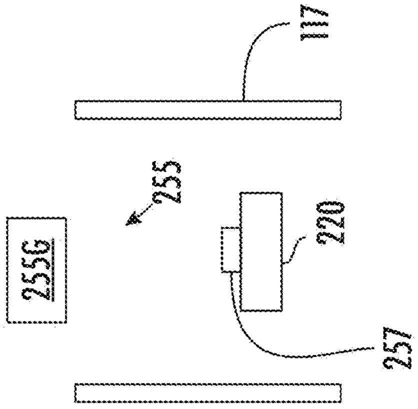
FIG. 18 shows a platform propulsor formed as a drone.

Turning to FIG. 10, a flowchart shows a method of performing maintenance within a hoistway 117.

As shown in block 1010, the method includes the controller 230 controlling movement of the robotic platform 220 within the hoistway 117.

As shown in block 1020, the method includes the controller 230 inspecting one or more components in the hoistway 117 to determine, from sensor data compared with hoistway model data, that an operational parameter or an alignment of the one or more components is outside predetermined positioning and operating tolerances. Such tolerances would be appreciated by one of ordinary skill.

As shown in block 1020A, the method includes the controller 230 utilizing the hoistway model data as a reference point for installing and/or maintaining one or more components in the hoistway.

As shown in block 1030, the method includes the controller 230 controlling the robotic platform 220 to execute one or more of: guide rail realignment; rope/belt inspection; ride quality tests; door couple alignment inspection; door switch test; and sill cleaning, to thereby determine that the operational parameter or the alignment of the component is outside predetermined positioning and operating tolerances.

As shown in block 1030A, the method includes the controller 230 engaging a segment 245 of an elevator guide rail 109 of the hoistway 117, to position the segment 245 within predetermined positioning and operating tolerances, upon determining, from sensor data compared with hoistway model data, that the segment 245 is positioned outside the predetermined positioning and operating tolerances.

As shown in block 1030B, the method includes the controller 230 engaging the guide rail 109 by loosening rail securing bolts, aligning the guide rail, and tightening rail securing bolts.

As shown in block 1040, the method includes the controller 230 periodically or within scheduled timeframes engaging the one or more components to determine that the operational parameter or the alignment of the component is outside predetermined positioning and operating tolerances.

As shown in block 1050, the method includes the controller defining the hoistway model data from sensed locations and shape boundaries of the hoistway and doorway openings formed in the hoistway.

As shown in block 1050A, the method includes the controller defining the hoistway model data to include sill to sill distances, guide rail to guide rail distances, sill to guide rail distances, and tilt and twist of the hoistway 117. In one embodiment the hoistway model data defines a three-dimensional model of the hoistway 117.

As shown in block 1050B, the method includes the controller 230 defining the hoistway model data as a three-dimensional model of the hoistway 117.

According to another aspect of the disclosed embodiments, the robotic platform 220 enables best practices and enables opportunities for mechanics in the field to simplify, support, and/or automate tasks and increase overall field efficiency. The robotic platform 220 equipped with different tools for installation and service tasks to allow for partial or full automation of the more time-consuming procedures, for example, guide rail installation and maintenance.

Turning to FIGS. 11-18, different solutions for propelling the robotic platform 220 are shown with a focus on propulsion, safety and anchoring of the robotic platform in the hoistway 117. The robotic platform 220 may operate in an empty hoistway 117 from a landing, or a pit, and may move inside the hoistway 117 using walls or dedicated ropes to move in the hoistway 117. The robotic platform 220, equipped with tools, may be utilized for scanning/inspecting the hoistway 117, taking measurements, grinding, marking drilling points, drilling, hoisting or securing the rail/door entrances within the hoistway 117. The robotic platform 220 may be self-propelled or be hoisted. The guide rail 109 may be utilized as a guide for the robotic platform 220. The robotic platform 220 may be locked in a position along the hoistway 117 using brakes on the robotic platform 220 or on the rail 109. When there are no guide rails, the robotic platform 220 may use friction against the hoistway walls 228, 228A (FIG. 4) to lock in place or, if available, lock against a rope.

The robotic platform 220 may be used for one or more of installation, maintenance and inspection. For example, the robotic platform 220 may be used for belt/rope monitoring, guide rail straightening, post earthquake hoistway inspection.

Benefits of the disclosed embodiments includes a decreased time to market a product, freeing mechanic time, competitive advantage from lower associated costs, increased precision and extended product life time, increased mechanic safety, decrease of repetitive motion injuries, and allowing for a more rapid design approach.

Each propulsion system illustrated in FIGS. 11-18 may function based on decision making that can be executed on the edge of a doorway or wirelessly (e.g., through the internet). Each propulsion system may be equipped with remote controlled safety system. Additionally there may a reference system, such as a global positioning system or hoistway model data, utilized to assist in directing the each propulsion system.

As indicated in FIGS. 11-18, the inspection system 200 includes the robotic platform 220 configured to inspect the hoistway 117, a platform propulsor 255 operationally connected to the robotic platform 220, and a controller 230 (shown only in FIG. 11 for simplicity) operationally connected to the platform propulsor.

Figure 19:
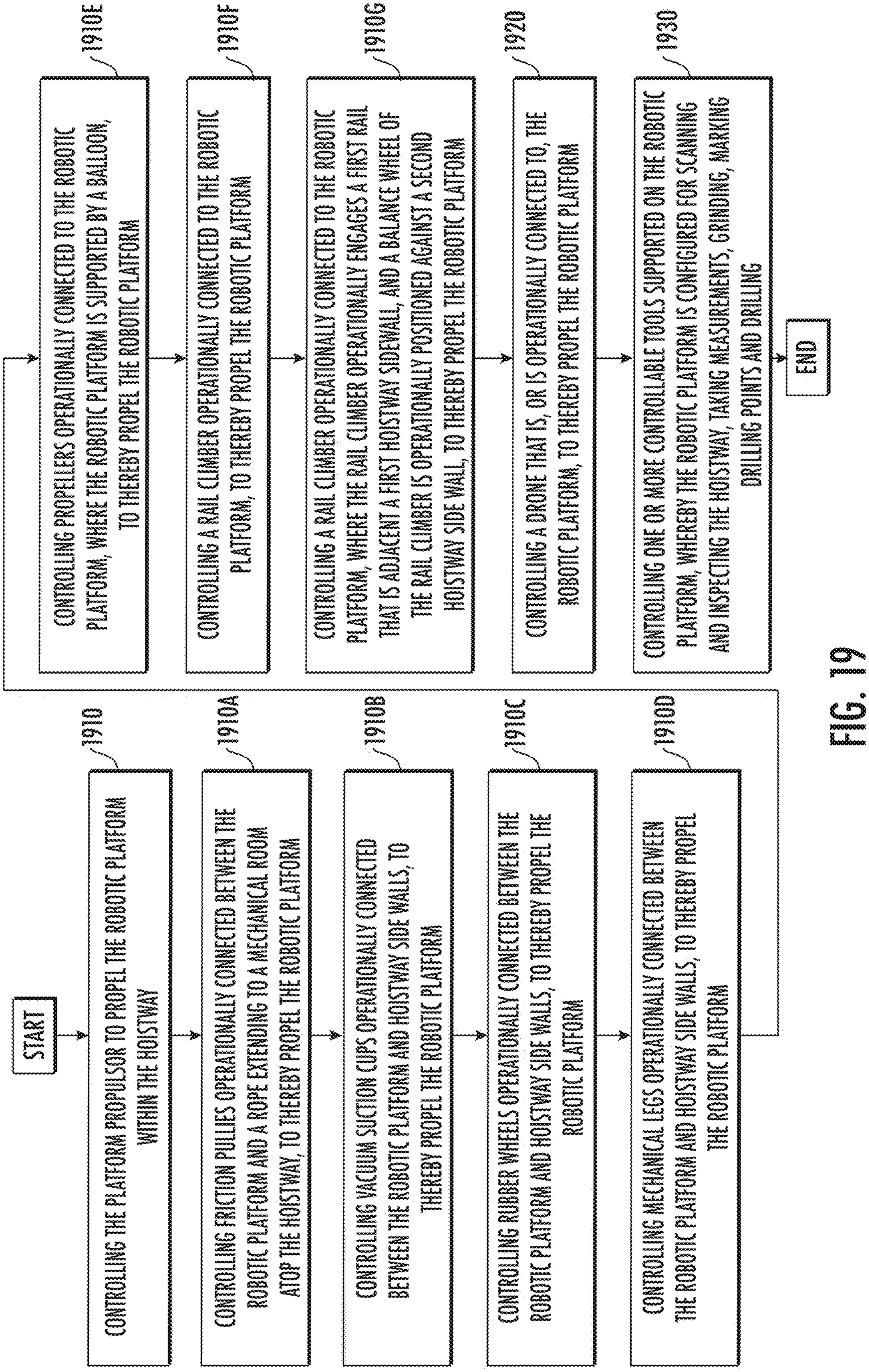
FIG. 19 is a flowchart showing a method of propelling a robotic platform in a hoistway.

Turning to FIG. 19, a flowchart shows a method of propelling the robotic platform 220 within the hoistway 117.

As shown in block 1910, the method includes the controller 230 controlling the platform propulsor 255 to propel (e.g., vertically) the robotic platform 220 within the hoistway 117.

As shown in block 1910A, the method includes the controller 230 controlling friction pullies 255A (FIG. 11) operationally connected between the robotic platform 220 and a rope 255A1 extending to a mechanical room 256 atop the hoistway 117 (and the pit 225), to thereby propel the robotic platform 220.

As shown in block 1910B, the method includes the controller 230 controlling vacuum suction cups 225B (FIG. 12) operationally connected between the robotic platform 220 and hoistway side walls 228, 228A, to thereby propel the robotic platform 220.

As shown in block 1910C, the method includes the controller 230 controlling rubber wheels 255C (FIG. 13) operationally connected between the robotic platform 220 and hoistway side walls 228, 228A, to thereby propel the robotic platform 220.

As shown in block 1910D, the method includes the controller 230 controlling mechanical legs 255D (FIG. 14; forming a spider-like set of supports) operationally connected between the robotic platform 220 and hoistway side walls 228, 228A, to thereby propel (e.g., by stemming) the robotic platform.

As shown in block 1910E, the method includes the controller 230 controlling propellers 255E (FIG. 15) operationally connected to the robotic platform 220, where the robotic platform 220 is supported by a balloon 255E1, to thereby propel the robotic platform 220.

As shown in block 1910F, the method includes the controller 230 controlling a rail climber 255F (FIG. 16) operationally connected to the robotic platform 220, to thereby propel the robotic platform 220.

As shown in block 1910G, the method includes the controller 230 controlling a rail climber 255F (FIG. 17) operationally connected to the robotic platform 220, where the rail climber 255F operationally engages a first rail 109 that is adjacent a first hoistway sidewall 228, and a balance wheel 255F1 of the rail climber 255F is operationally positioned against a second hoistway side wall 228A, to thereby propel the robotic platform 220.

As shown in block 1920, the method includes the controller 230 controlling a drone 255G (FIG. 18; illustrated schematically: see the robotic platform 220 in FIG. 2) that is, or is operationally connected to, the robotic platform 220, to thereby propel the robotic platform 220.

As shown in block 1930, the method includes the controller 230 controlling one or more controllable tools 257 (FIG. 18; illustrated schematically) supported on the robotic platform 220, whereby the robotic platform 220 is configured for scanning and inspecting the hoistway 117, taking measurements, grinding, marking drilling points and drilling.

Figure 20:
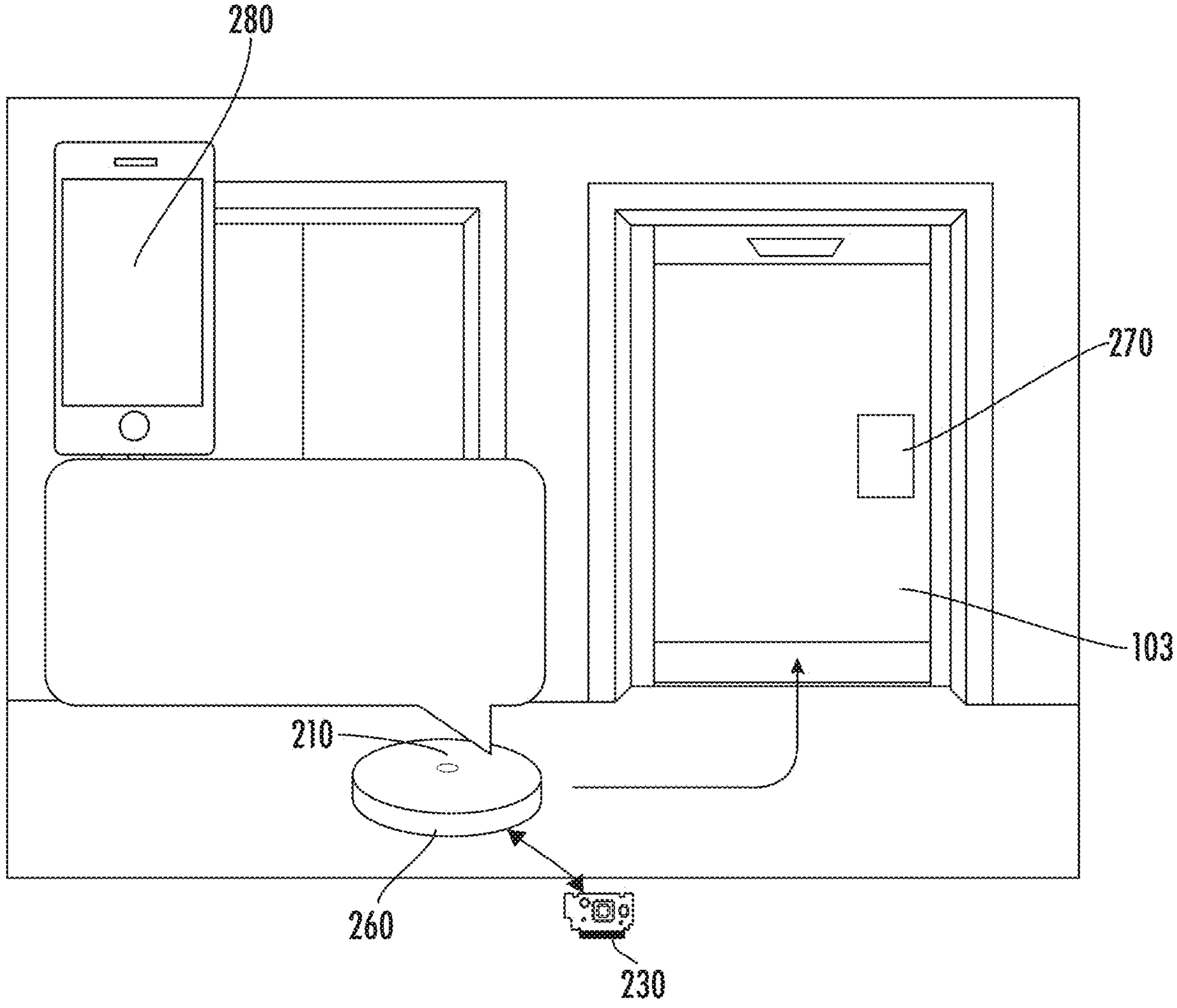
FIG. 20 shows an inspection robot for an elevator system.

According to an addition aspect of the disclosed embodiments, and turning to FIG. 20, the disclosed embodiments provide a mobile robot (for simplicity, a robot 260), which may also be considered a robotic platform. The robot 260 is capable of monitoring, cleaning, adjusting elevator parameters, measuring performance and requesting maintenance of an elevator car 103 or elevator groups in a building. The robot 260 is configured for performing tests using a built-in sensor implement 210, such as a camera (to monitor sill conditions, and landing alignments), an accelerometer, and/or a microphone (to monitor ride quality). The robot 260 is able to communicate with the elevator car 103 and execute runs, emergency stops, open/close door cycles and modify basic parameters. The robot 260 may also perform measurements during predetermined time conditions (e.g., off peak, no passengers). The robot 260 may or may not be equipped with propulsion and may or may not require human intervention to move between elevator cars. The inspection system 200 of this embodiment may utilize a built-in or external gateway that is connected using different protocols for example, Bluetooth low energy (BLE) to a phone, and thereafter a cellular protocol such as Global System for Mobile Communications (GSM) to bridge the robot 260 to the Internet.

Benefits of the disclosed embodiments include field time reduction for mechanics, automated periodic testing and system adjustments, continuous system performance tracking, historical data base supporting CBM and the development of predictive maintenance. A competitive advantage may be realized from the decreased operational costs and increased launch and up-time.

Thus, the disclosed embodiments provide a non-propelled robot 260 to execute maintenance tasks, e.g., as a mechanics helper. The robot 260 may communicate with the elevator system 101 to place commands, as well as support the sensor implement 210 such as a camera and a ride-quality sensor (an accelerometer and/or microphone). The robot 260 may conduct inspections and make recommendations as to daily maintenance tasks.

As indicated (FIG. 20) an elevator inspection system 200, configured to inspect multiple elevator cars in a group of elevator cars, is disclosed that includes a sensor implement 210, a robot 260 supporting the sensor implement 210 and a controller 230 operationally connected to the robot and the senor. The robot 260 is configured to be positioned in an elevator car 103.

Figure 21:
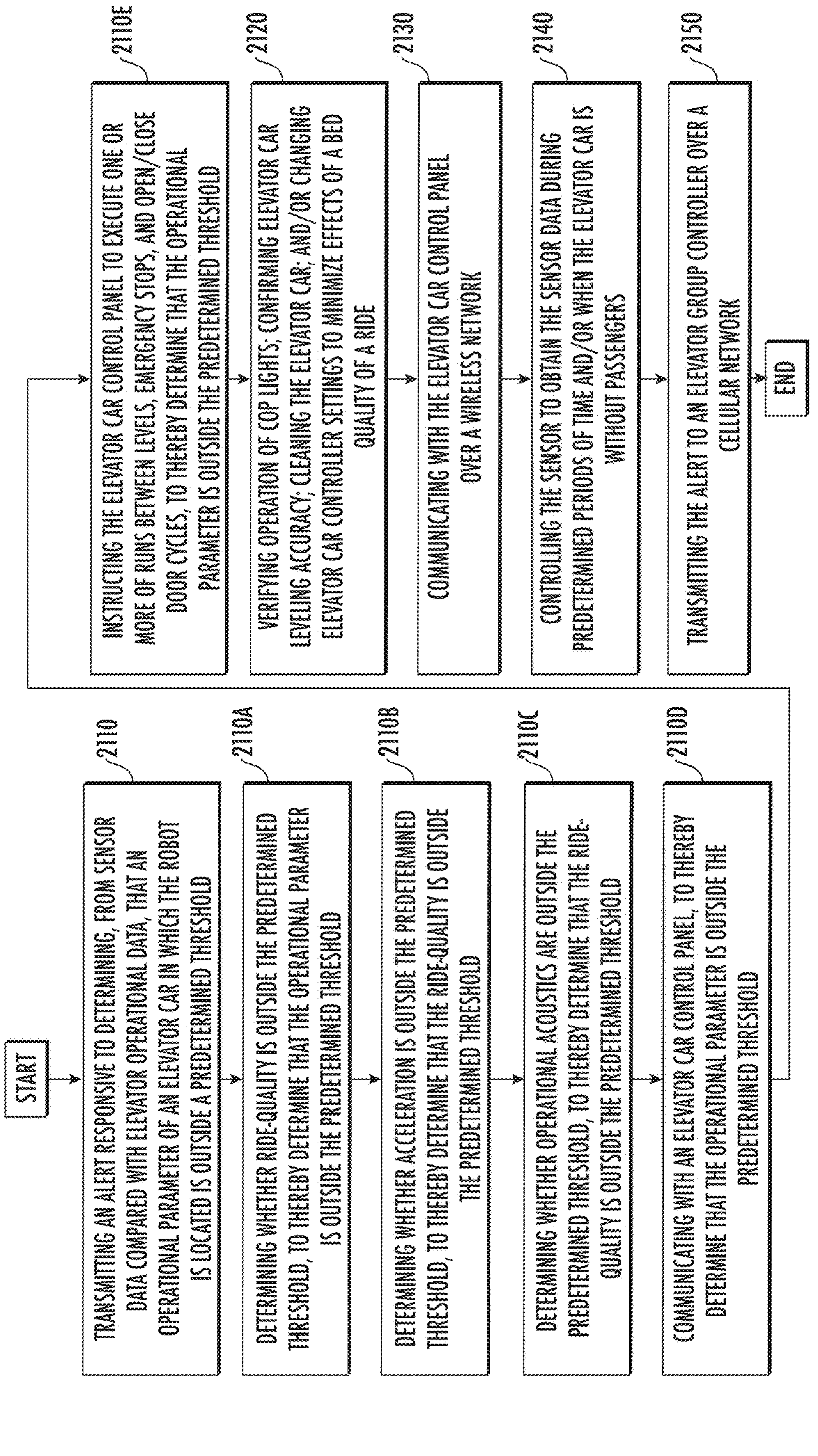
FIG. 21 is a flowchart showing a method of performing an elevator operational inspection with a mobile robot.

FIG. 21 is a flowchart showing a method of performing an elevator operational inspection with the robot 260.

As shown in block 2110, the method includes the controller 230 transmitting an alert, e.g., to a mechanic, responsive to determining, from sensor data compared with elevator operational data, that an operational parameter of an elevator car 103 in which the robot 260 is located is outside a predetermined threshold (where such threshold values would be understood by one of ordinary skill).

As shown in block 2110A, the method includes the controller 230 determining whether ride-quality is outside the predetermined threshold, to thereby determine that the operational parameter is outside the predetermined threshold.

As shown in block 2110B, the method includes the controller 230 determining whether acceleration is outside the predetermined threshold, to thereby determine that the ride-quality is outside the predetermined threshold.

As shown in block 2110C, the method includes the controller 230 determining whether operational acoustics are outside the predetermined threshold, to thereby determine that the ride-quality is outside the predetermined threshold.

As shown in block 2110D, the method includes the controller 230 communicating with an elevator car control panel 270, to thereby determine that the operational parameter is outside the predetermined threshold.

As shown in block 2110E, the method includes the controller instructing the elevator car control panel to execute one or more of runs between levels, emergency stops, and open/close door cycles, to thereby determine that the operational parameter is outside the predetermined threshold.

As shown in block 2120, the method includes the controller 230: verifying operation of car operation panel (COP) lights; confirming elevator car leveling accuracy; cleaning the elevator car via the robot; and/or changing elevator car controller settings to minimize effects of a bed quality of a ride.

As shown in block 2130, the method includes the controller 230 communicating with the elevator car control panel 270 over a wireless network, which may be a personal area network.

As shown in block 2140, the method includes the controller 230 controlling the sensor implement to obtain the sensor data during predetermined periods of time and/or when the elevator car is without passengers.

As shown in block 2150, the method includes the controller 230, which is onboard the robot 260, transmitting the alert to an elevator group controller over a cellular network 280.

As used herein an elevator controller may be a microprocessor-based controller that controls many aspects of the elevator operation. A series of sensor implements, controllers, sequences of operation and real-time calculations or algorithms that balance passenger demand and car availability. Elevator sensor implements may provide data on car positions, car moving direction, loads, door status, hall calls, car calls, pending up hall and down hall calls, number of runs per car, alarms, etc. The controllers may also have a function enabling the testing the systems without shutdown of the elevator. From collected data, a management system consisting of a workstation and software applications that may create metrics for a group or particular car such as total number of door openings, number of runs per car or call, up and down hall calls, etc. Some performance indicators may be related to passenger wait times and/or elevator car travel times. These metrics may indicate inadequate controls, misconfiguration or even equipment malfunction. Elevator monitoring may be provided as Software as a Service (SaaS). The monitoring may identify malfunctions or abnormal operating parameters and automatically dispatch a technician and/or provide alerts to relevant persons such as building owners. Some systems may provide customer dashboards accessible via a web browser and/or provide owners with information such as performance summaries and maintenance histories. As indicated, the elevator controller may communicate with the one or more elevators over a Controller Area Network (CAN) bus. A CAN is a vehicle bus standard that allow microcontrollers and devices to communicate with each other in applications without a host computer. CAN is a message-based protocol released by the International Organization for Standards (ISO). Downstream communications from the elevator system controller may be over a LAN.

As described above, embodiments can be in the form of processor-implemented processes and devices for practicing those processes, such as a processor. Embodiments can also be in the form of computer program code containing instructions embodied in tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an device for practicing the embodiments. When implemented on a general-purpose microprocessor, the computer program code segments configure the microprocessor to create specific logic circuits.

The terminology used herein is for the purpose of describing particular embodiments only and is not intended to be limiting of the present disclosure. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. An elevator inspection system, comprising:

a sensor implement;

a robotic platform supporting the sensor implement, the robotic platform configured to inspect a hoistway; and a controller operationally connected to the robotic platform and the sensor implement, wherein:

the controller is configured to define hoistway model data, for the hoistway, from maintenance and performance data collected from disparately located elevator systems connected to communicate over a network; and the controller is configured to define the hoistway model data to include sill to sill distances, guide rail to guide rail distances, sill to guide rail distances, and tilt and twist of the hoistway.

2. The system of claim 1, wherein the controller is configured to define the hoistway model data from maintenance and performance data collected over the Internet and utilize cloud computing for analytics.

3. The system of claim 1, wherein the controller is configured to identify maintenance and performance trends from the collected maintenance and performance data.

4. The system of claim 3, wherein the controller is configured to determining a frequency of monitoring the hoistway from the hoistway model data.

5. The system of claim 1, wherein the controller is configured to define the hoistway model data to include, for an elevator car in the hoistway, one or more of: maintenance needs; ride quality; a motion profile; and door performance.

6. The system of claim 1, wherein the controller is configured to determine to substantially continuously monitor the hoistway from the hoistway model data.

7. The system of claim 1, wherein the controller is configured to further define the hoistway model data from sensed locations and shape boundaries of the hoistway and doorway openings formed in the hoistway.

8. The system of claim 1, wherein the controller is configured to utilize the hoistway model data as a reference point for installing and/or maintaining one or more components in the hoistway.

9. The system of claim 1, wherein the controller is configured to transmit an alert upon identifying, from sensor data compared with hoistway model data, when a component of an elevator system installed in the hoistway is positioned or operating outside of predetermined positioning and operating tolerances.

10. A method of determining whether components of an elevator system are positioned and operating within predetermined positioning and operating tolerances, comprising:

defining, by a controller, hoistway model data, for a hoistway, from maintenance and performance data collected from disparately located elevator systems connected to communicate over a network, wherein the controller is operationally connected to a robotic platform supporting a sensor implement, and wherein the robotic platform configured to inspect the hoistway; and defining, by the controller, the hoistway model data to include sill to sill distances, guide rail to guide rail distances, sill to guide rail distances, and tilt and twist of the hoistway.

11. The method of claim 10, comprising defining, by the controller, the hoistway model data from maintenance and performance data collected over the Internet and utilizing cloud computing for analytics.

12. The method system of claim 10, comprising identifying, by the controller, maintenance and performance trends from the collected maintenance and performance data.

13. The method of claim 12, comprising determining, by the controller, a frequency of monitoring the hoistway from the hoistway model data.

14. The method of claim 10, comprising defining, by the controller, the hoistway model data to include, for an elevator car in the hoistway, one or more of: maintenance needs; ride quality; a motion profile; and door performance.

15. The method of claim 10, comprising determining, by the controller, to substantially continuously monitor the hoistway from the hoistway model data.

16. The method of claim 10, comprising further defining, by the controller, the hoistway model data from sensed locations and shape boundaries of the hoistway and doorway openings formed in the hoistway.

17. The method of claim 10, comprising utilizing, by the controller, the hoistway model data as a reference point for installing and/or maintaining one or more components in the hoistway.

18. The method of claim 10, comprising transmitting, by the controller, an alert upon identifying, from sensor data compared with hoistway model data, when a component of an elevator system installed in the hoistway is positioned or operating outside of predetermined position and operating tolerances.

* * * * *